(12) United States Patent
Goward et al.

(10) Patent No.: US 10,566,214 B1
(45) Date of Patent: Feb. 18, 2020

(54) SEED LAYER FREE NANOPOROUS METAL DEPOSITION FOR BONDING

(71) Applicant: Facebook Technologies, LLC, Menlo Park, CA (US)

(72) Inventors: John Michael Goward, Ayr (GB); Brian Matthew McSkimming, Redmond, WA (US); Chloe Astrid Marie Fabien, Seattle, WA (US); Stephen John Holmes, Glasgow (GB)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/197,685

(22) Filed: Nov. 21, 2018

Related U.S. Application Data

(60) Provisional application No. 62/702,492, filed on Jul. 24, 2018.

(51) Int. Cl.
| | |
|---|---|
| *H01L 23/00* | (2006.01) |
| *H01L 21/48* | (2006.01) |
| *H01L 21/56* | (2006.01) |
| *C23C 14/34* | (2006.01) |
| *C23C 14/14* | (2006.01) |

(52) U.S. Cl.
CPC .......... *H01L 21/4853* (2013.01); *C23C 14/14* (2013.01); *C23C 14/3442* (2013.01); *H01L 21/563* (2013.01); *H01L 24/81* (2013.01); *H01L 2224/81201* (2013.01); *H01L 2924/1532* (2013.01); *H01L 2924/15717* (2013.01); *H01L 2924/15738* (2013.01); *H01L 2924/15747* (2013.01)

(58) Field of Classification Search
CPC ......... H01L 24/01; H01L 24/10; H01L 24/11; H01L 24/12; H01L 24/13; H01L 24/19; H01L 24/81
See application file for complete search history.

(56) References Cited

U.S. PATENT DOCUMENTS

2013/0245416 A1* 9/2013 Yarmush .................. H01B 7/30
600/396

* cited by examiner

*Primary Examiner* — Cuong Q Nguyen
(74) *Attorney, Agent, or Firm* — Fenwick & West LLP

(57) ABSTRACT

Embodiments relate to forming nanoporous contacts on a receiving substrate without using a seed layer on the receiving substrate. The nanoporous contacts can be used to create bonds between electronic components and the receiving substrate. To form the contacts, a photoresist mask is created on the receiving substrate by a photolithographic process. Through a sputtering process, portions of co-alloy on a depositing substrate are transferred to the receiving substrate with the photoresist mask. The photoresist mask is removed from the receiving substrate. The remaining co-alloy portions on the receiving substrate undergo a de-alloying process to form an array of nanoporous contacts.

20 Claims, 7 Drawing Sheets

SEED LAYER FREE NANOPOROUS METAL DEPOSITION FOR BONDING

CROSS-REFERENCES TO RELATED APPLICATION

This application claims priority U.S. Provisional Patent Application Ser. No. 62/702,492, titled "Seed Layer Free Nanoporous Metal Deposition for Bonding," filed on Jul. 24, 2018, which is incorporated by reference herein in its entirety.

BACKGROUND

The present disclosure relates to nanoporous deposition, and specifically, to forming nanoporous contacts on a receiving substrate without a seed layer.

During microfabrication of electronic components, components are bonded together to create electrical connections between the components. In some situations, materials with different thermal expansion properties are bonded together. However, the different thermal expansion properties can be problematic when the high temperatures (e.g., 200-300° C.) and pressures are used during typical bonding processes.

In some situations, nanoporous materials are formed to facilitate bonding between electrical components. To form a nanoporous material, a co-alloy is deposited on a seed layer (e.g., through a plating process). Afterwards, the co-alloy is de-alloyed to form the nanoporous material. To prevent lateral shorts between adjacent electrical contacts, the seed layer is removed from the substrate. However, the difficulty of removing the seed layer can limit the form factors of the nanoporous material.

For example, if the spacing between electrical contacts is a few micrometers or less, wet etching processes to remove the seed layer can also remove the formed nanoporous material. As such, a dry etching process may be used. However, during a dry etching process the seed layer will be re-deposited within the etch chamber, making the etch chamber unusable for other purposes. Additionally during the dry etching process, materials of the seed layer may be re-deposited on the sidewalls of the small nanoporous metal features. Furthermore, typical dry etching processes, such as inductively coupled plasma etching (ICP) or reactive ion-etching (ME) are ineffective because the metal species in nanoporous materials may not form volatile species during the etching process. An ion milling process may be used. However, the ion milling process may involve a masking or shuttering process or a sacrificial etch mask to prevent the ion milling process from altering or damaging the nanoporous material or other components. Thus, seed layer removal process is difficult and costly, especially as the form factor of electrical components decreases.

SUMMARY

Embodiments relate to forming nanoporous contacts on a receiving body without a seed layer. The body may refer to a substrate or an electronic component. A co-alloy is deposited on a surface of a depositing substrate. Part of the co-alloy is transferred from the depositing substrate onto at least a portion of a receiving body. The transferred part of the co-alloy is de-alloyed to form nanoporous metal contacts on the receiving body.

In some embodiments, a mask is applied over a surface of the receiving body before transferring part of the co-alloy from the depositing substrate. The mask is removed from the surface of the receiving body after transferring the part of the co-alloy.

In some embodiments, transferring part of the co-alloy comprises causing sputtering of particles of the co-alloy from the depositing substrate onto the receiving body by exposing the co-alloy on the surface of the depositing substrate to an ion beam.

In some embodiments, electrodes of one or more mounting bodies are aligned with the nanoporous metal contacts of the receiving body. The one or more mounting bodies are placed on the body. The electrodes are bonded to the nanoporous metal contacts by pressing the electrodes onto the nanoporous metal contacts to form metallic (e.g., solid state bonded) contacts between the mounting bodies and the receiving body. In some embodiments, the receiving body comprises a substrate and the mounting bodies comprise electronic components.

In some embodiments, the bonding temperature is not greater than 150° C.

In some embodiments, the mask is applied over the receiving body before transferring part of the co-alloy from the depositing substrate. After transferring the part of the co-alloy, the mask is removed from the surface of the receiving body. The mask can be formed over the receiving body by forming a photoresist on the receiving body. A photolithographic mask is applied over the photoresist to selectively cover the photoresist. Portions of the photoresist are exposed to light that are not covered with the photolithographic mask to cure portions of the photoresist. The cured portions of the photoresist are removed. Alternatively, a patterned passivation layer can substitute the photoresist mask. Among other advantages, the patterned passivation layer may not be removed later in the process and can assist in hybrid bonding as an alternative to an underfill.

In some embodiments, a film of underfill is applied to cover the surface of the receiving body and the nanoporous metal contacts after de-alloying the transferred portions. Portions of the underfill are etched to expose the nanoporous metal contacts. Contacts of another substrate or an electronic component are pressed onto the nanoporous metal contacts to bond the other substrate or the electronic component to the receiving body.

In some embodiments, the co-alloy includes copper (Cu) and zinc (Zn) or gold (Au) and silver (Ag).

In some embodiments, the nanoporous metal contacts are formed on pre-formed metal contacts of the receiving body.

In some embodiments, portions of the transferred part of the co-alloy are removed from the receiving body before de-alloying.

The figures depict various embodiments of the present disclosure for purposes of illustration only. One skilled in the art will readily recognize from the following discussion that alternative embodiments of the structures and methods illustrated herein may be employed without departing from the principles of the disclosure described herein.

DETAILED DESCRIPTION

In the following description of embodiments, numerous specific details are set forth in order to provide more thorough understanding. However, note that the embodiments may be practiced without one or more of these specific details. In other instances, well-known features have not been described in detail to avoid unnecessarily complicating the description.

Embodiments are described herein with reference to the figures where like reference numbers indicate identical or functionally similar elements. Also in the figures, the left most digits of each reference number corresponds to the figure in which the reference number is first used.

Embodiments relate to forming nanoporous contacts on a receiving substrate without using a seed layer on the receiving substrate. The nanoporous contacts can be used to create bonds between electronic components and the receiving substrate. To form the contacts, a photoresist mask is created on the receiving substrate by a photolithographic process. Through a sputtering process, portions of co-alloy on a depositing substrate are transferred to the receiving substrate with the photoresist mask. The photoresist mask is removed from the receiving substrate. The remaining co-alloy portions on the receiving substrate undergo a de-alloying process to form an array of nanoporous contacts.

Figure 1A:
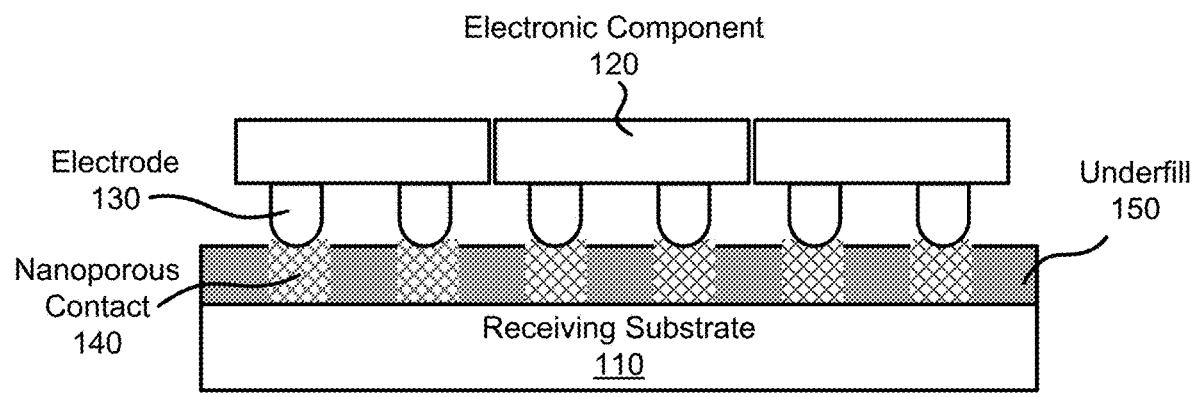
FIG. 1A illustrates electronic components placed on a receiving substrate prior to bonding, according to an embodiment.
Figure 1B:
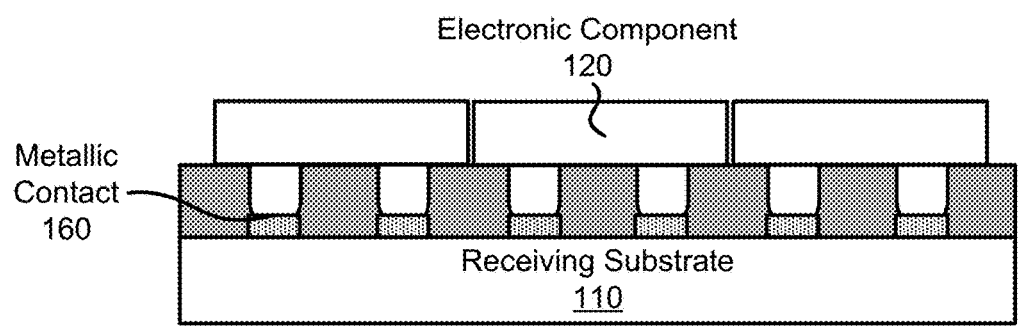
FIG. 1B illustrates electronic components bonded to the receiving substrate, according to an embodiment.

FIG. 1A illustrates electronic components 120 placed on a receiving substrate 110 prior to bonding, according to an embodiment. FIG. 1B illustrates electronic components 120 bonded to the receiving substrate 110, according to an embodiment. Prior to the bonding process, electrodes 130 of the electronic components 120 are aligned with and placed on nanoporous contacts 140 on the surface of the receiving substrate 110. An underfill 150 lies across the surface of the receiving substrate 110 and around the nanoporous contacts 140. During bonding, the nanoporous contacts 140 can compress, and part of the electrodes 130 and part of the nanoporous contacts 140 melt to form metallic contacts 160. This bonding process can be done in parallel for multiple electronic components 120 placed on the receiving substrate 110 if gang bonding is employed. Alternatively, the underfill can be deposited on the electronic component surface prior to bonding individual components 120.

The electronic components 120 can be electronically connected to the receiving substrate 110 and can include other substrates (e.g., similar to the receiving substrate 110) and/or surface-mounted devices (SMDs), such as light-emitting diode (LED) dies, photodiodes, and vertical-cavity surface-emitting lasers (VCELs). In some embodiments, the electronic components 120 are micro-LED (µLED) dies (e.g., composed of GaN or GaAs). The electronic components 120 can include any number of electrodes 130 in contact with the nanoporous contacts 140. Prior to bonding, the electrodes 130 of each electronic component 120 can be aligned with and placed on the nanoporous contacts 140 by a pick-up head. Alternatively, an array of electronic components 120 and their electrodes 130 can be aligned with and placed on an array of nanoporous contacts 150 in a single step (this may be referred to as a monolithic approach).

The receiving substrate 110 mechanically supports and can electronically connect to the electronic components 120. For example, the receiving substrate 110 is a semiconductor substrate that includes traces, contacts, and other components fabricated using complementary metal-oxide-semiconductor (CMOS) technology. The receiving substrate 110 can support any number or combination of electronic components 120. The receiving substrate 110 may include circuits that are completed once one or more electronic components 120 are placed onto the receiving substrate 110. In some embodiments, the receiving substrate 110 can include a control circuit that drives current in the receiving substrate 110. For example, the receiving substrate 110 is a silicon display substrate of an electronic display. In this example, the electronic components 120 may be LED dies and the LED dies may be placed at pixel or sub-pixel locations to connect the LED dies to control circuits in the display substrate. In this way, the control circuit can drive the electronic display by applying current to the LED dies. In some embodiments, the receiving substrate 110 is one or more other electronic components 120 as described above. For example, the receiving substrate 110 is a µLED structure and the nanoporous contacts 140 will facilitate the bonding of n and p contacts to the µLED structure.

In some embodiments, an underfill 150 is formed on the receiving substrate 110. The underfill 150 can be a polymer that improves the mechanical strength of the metallic contacts 160 formed between the electrical components 120 and the receiving substrate 110. The underfill 150 is further described with reference to FIGS. 6A and 6B.

The metallic contacts 160 are electrical connections between the electrodes 130 of the electronic components 120 and the nanoporous contacts 140 of the receiving substrate 110. The metallic contacts 160 are formed during the bonding process by heating the electrodes 130 and nanoporous contacts 150. Pressure may also be applied (e.g., by a pick-up head) to the electronic components 120 and the receiving substrate 110 to form the metallic contacts 160. When pressure is applied, the nanoporous contacts 140 can compress or collapse. When both heat and pressure are applied, the process is referred to as thermocompression (TC) bonding.

During bonding, the electrodes 130 and nanoporous contacts 140 can be heated by a hot plate (not shown). The temperature of the electrodes 130 and nanoporous contacts 140 can also be controlled by another method or apparatus, such as a laser beam that locally heats the electrodes 130 and nanoporous contacts 140. For example, after multiple electronic components 120 are placed, a laser setup may be employed to selectively heat individual electrodes 130.

The nanoporous contacts 140 are an array of discrete blocks of electrically conductive nanoporous material positioned on the receiving substrate 110. The nanoporous contacts 140 include a plurality of pores that are distributed across the blocks. The porous structure is formed of a plurality of ligaments. The ligaments may have a size of approximately 100 nm or smaller, depending upon the material and the process used in forming the contacts. In some embodiments, the nanoporous contacts 140 have heights from 10's of microns to sub-micron with an aspect ratio of 1:1 or higher. The nanoporous contacts 140 can be continuous nanoporous metal (NPM) or a thin layer of NPM deposited on pre-formed metal (e.g., gold or copper) contacts of the receiving substrate 110. Although the nanoporous contacts 140 have similar shapes and are evenly spaced apart in FIG. 1A, the nanoporous contacts can be different shapes and located anywhere on the surface of the receiving substrate 110. The nanoporous contacts 140 can be formed of metallic materials based on the materials' thermal conductivity, electrical conductivity, and compressibility. In one embodiment, the nanoporous contacts 140 are formed of nanoporous gold. Nano-porous gold may be used because gold has good thermal and electrical conductivity and also because nanoporous gold is highly malleable so that the nanoporous gold can serve as a "sponge" to be compressed. Other materials such as copper, silver, gold, platinum, and/or alloys of some combination thereof can be used. In other embodiments, the nanoporous contacts 140 may include other metals, semi-metals, or conductive non-metals.

The use of nanoporous contacts 140 instead of solder to bond the electrodes 130 to the receiving substrate 110 can be advantageous, among other reasons, because, when compressed, the nanoporous contacts 140 do not spread laterally across the receiving substrate 110 compared to solder. Thus, shorting of an electronic component 120 due to solder extending between electrodes 130 can be prevented. Furthermore, metallic contacts 160 formed from nanoporous contacts 140 can be made at temperatures lower than typical bonding temperatures (e.g., 200-300° C.) used for forming metallic contacts without nanoporous contacts 140. This is based on the ligament size and due to the reduced material modulus of the nanoporous contacts compared to bulk metal contacts. For example, the metallic contacts 160 can be formed at temperatures generally less than 150° C. This can be advantageous when the electronic components 120 and receiving substrate 110 have different coefficients of thermal expansion (CTE). Additionally, due to the ligaments, the metallic contacts 160 can be formed at lower pressures. For example, the bonding pressure can be ten (or more) times smaller than typical bonding pressures. Among other advantages, this can reduce lateral shifts by the electronic components 120 (and thus increase placement accuracy of the components 120) during the bonding process.

Typically, the formation of nanoporous material involves the use of a seed layer. The use of a seed layer involves a removal process after the nanoporous material is formed. For example, if the separation distance between features is a few micrometers or less, the seed layer may be removed by a dry etching process. However, the dry etching process can result in re-deposition of the seed layer on the nanoporous material. Thus, a seed layer can limit the density and feature size of the nanoporous material. However, as described with reference to FIGS. 2-5B, the nanoporous contacts 140 can be formed without a seed layer on the receiving substrate 140. Thus, among other advantages, a seed layer does not need to be removed after the nanoporous contacts 140 are formed, and the nanoporous contacts 140 can have higher densities and smaller feature sizes.

Figure 2:
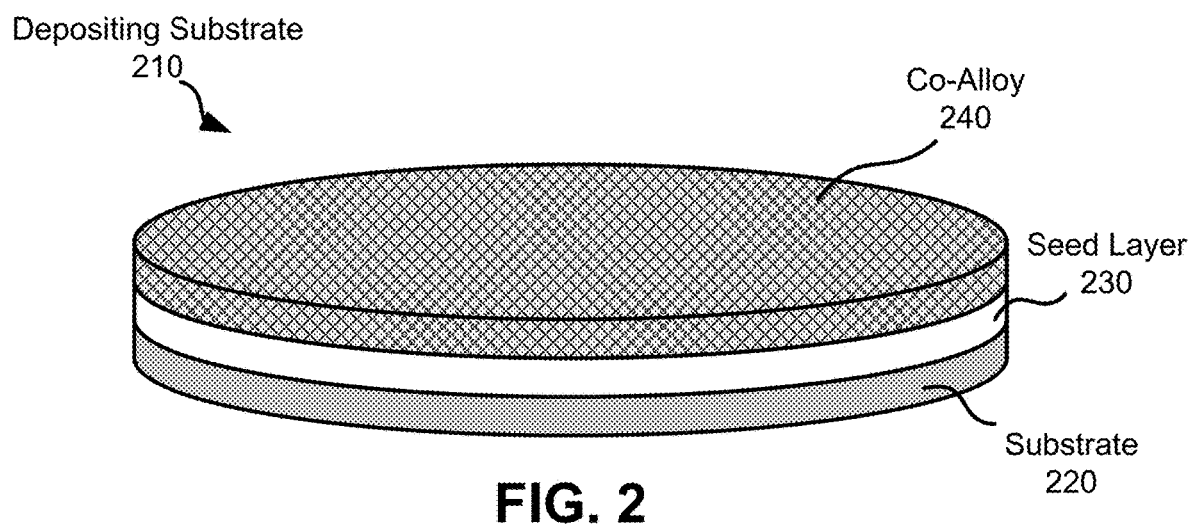
FIG. 2 is a perspective view of a depositing substrate, according to an embodiment.

FIG. 2 is a perspective view of a depositing substrate 210, according to an embodiment. The depositing substrate 210 can be used to transfer parts of a co-alloy 240 to the receiving substrate 110 (described with reference to FIG. 4).

The depositing substrate 210 includes a substrate 220, a seed layer 230, and a co-alloy layer 240. The substrate 220 mechanically supports the seed layer 230 and co-alloy layer 240. The seed layer 230 is on the top surface of the substrate 220, and a co-alloy layer 240 is on the top surface of the seed layer 230.

The seed layer 230 is a layer used for depositing the co-alloy on the substrate 220, as well known in the art. The seed layer 230 may include, among others, an adhesion or diffusion barrier layer, such as fifty nanometers of a titanium tungsten (TiW) alloy below one hundred nanometers of gold (Au). Alternatively or additionally, Palladium (Pd) or platinum (Pt) can be included in the adhesion or diffusion barrier layer.

The co-alloy 240 is a uniformly distributed metal alloy that can be used to form nanoporous contacts 140 on the receiving substrate 110. The co-alloy 240 includes at least two noble metals, a noble metal and a less noble metal. Typically, the co-alloy 240 includes a greater percentage of the less noble metal, such as 50%-80%. Examples of copper co-alloys include CuZn, CuCr, CuAl, CuNi, CuSn, CuCo, CuFe, and CuMn. The co-alloy 240 can be deposited on the seed layer 230 by various deposition techniques, such as electro-deposition, reverse pulse plating, vacuum deposition, and laser ablation.

Figure 3A:
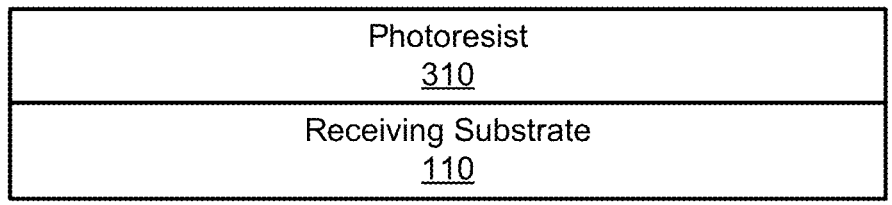
FIGS. 3A-3C are a sequence of schematic diagrams illustrating a photolithographic process that forms a photoresist mask on the receiving substrate, according to an embodiment.
Figure 3B:
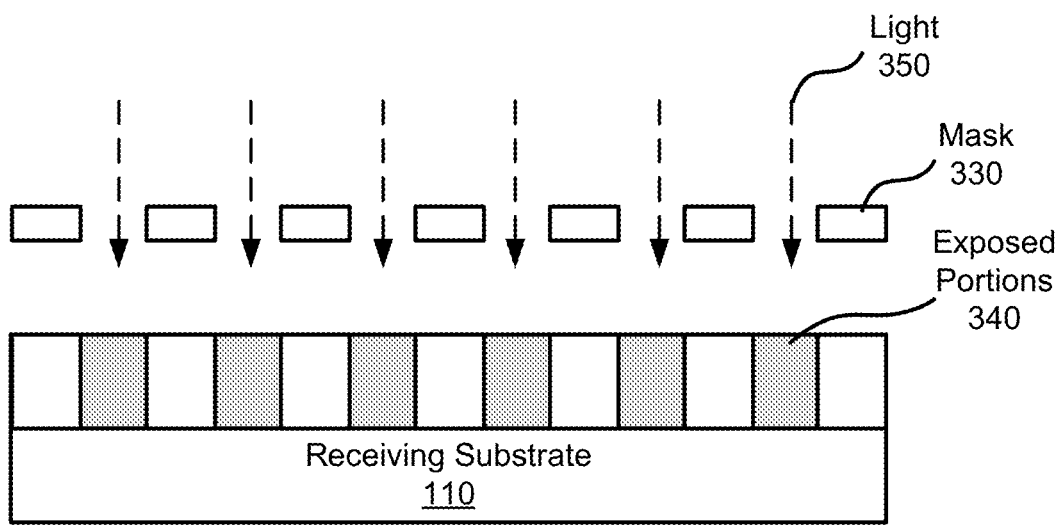
Figure 3C:
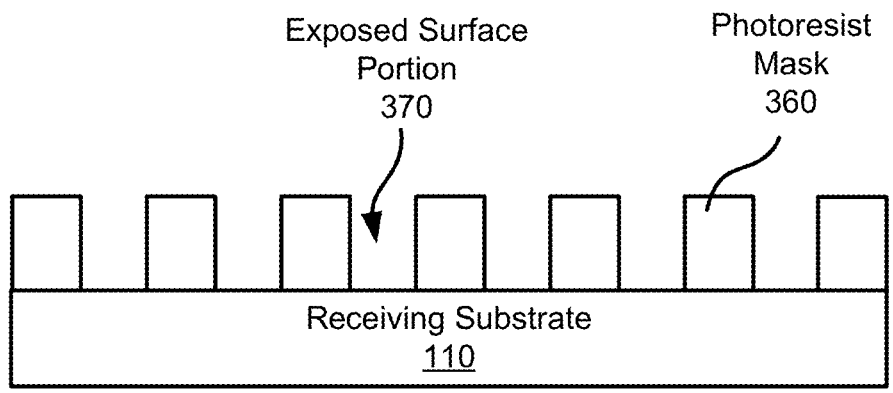

FIGS. 3A-3C are a sequence of schematic diagrams illustrating a photolithographic process that forms a photoresist mask 360 on the receiving substrate 110, according to an embodiment. The photoresist mask 360 allows the nanoporous contacts to be selectively formed on the receiving substrate 110. Thus, the photoresist mask 360 can define the feature size, spacing, and location of the nanoporous contacts 140.

FIG. 3A illustrates a photoresist 310 formed over a surface of the receiving substrate 110, according to an embodiment. The photoresist 310 is a light sensitive material that can be used to form a patterned coating. If the photoresist 310 is a positive photoresist, portions that are exposed to light (e.g., Ultraviolet (UV) wavelengths) can become soluble to a photoresist developer. If the photoresist is a negative photoresist, portions that are exposed to light become insoluble to the photoresist developer. In some embodiments, the photoresist developer is a sodium or potassium carbonate solution. To place the photoresist 310, the photoresist 310 may be mixed with a solvent such that the viscosity of the photoresist 310 is low enough for placement (e.g., via spin coating) onto the receiving substrate 110, and then baked (e.g., soft baking). Compared to conventional methods of using electroplating in combination with a photoresist to form a pattern, embodiments described herein are advantageous because the aggressive chemistry associated with the electroplating process impacts the resolution of the features in the photoresist for forming the pattern. Therefore, the embodiments described herein enable the use of a wider variety of photoresists and better retention of features in the photoresist.

FIG. 3B illustrates a mask 330 exposing portions 340 of the photoresist 310 to light 350, according to an embodiment. The mask 330 may be referred to as a photolithographic mask. To form the photoresist mask 360, light 350 is applied towards the photoresist 310 through the mask 330. In the example of FIG. 3B, the photoresist 310 is a positive photosensitive material. The mask 330 covers portions of the photoresist 310 so that the light 350 only shines on portions that will be removed (the exposed portions 340). The portions 340 exposed to the light 350 become soluble photosensitive material and can be removed by a photoresist developer, while portions of the photoresist 310 shielded from the light 310 remain insoluble. In some embodiments, the photoresist 310 is a negative photosensitive material. In these embodiments, a mask can cover portions of the photoresist 310 that will be removed. In alternative embodiments, portions of the photoresist 310 can be exposed 340 to light 350 by devices, such as by a stepper, a laser writer, or an electron beam.

FIG. 3C illustrates a photoresist mask 360 formed on the receiving substrate 110, according to an embodiment. By removing the exposed portions 340 of the photoresist 310, portions 370 of the receiving substrate 110 are exposed and, the remaining portions of the photoresist 310 form the photoresist mask 360. Together, the photoresist mask 360 and the exposed surface portions 370 of the receiving substrate form a mold for forming nanoporous contacts 140. Although the exposed surface portions 370 are evenly spaced apart in FIG. 3C, it should be appreciated that the exposed surface portions 370 can be located anywhere on the surface of the receiving substrate 110 that an electrical connection is desired.

Figure 4:
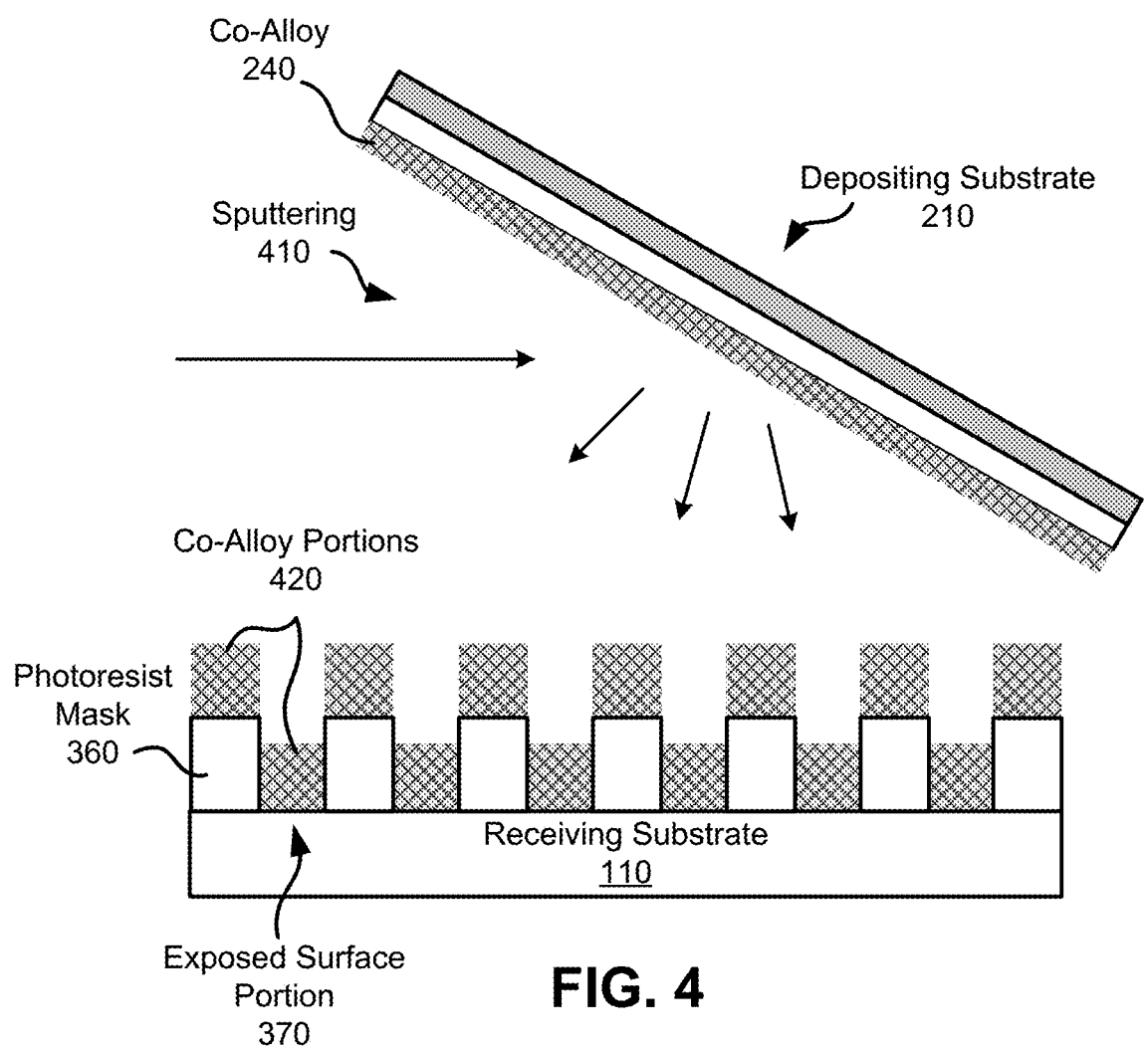
FIG. 4 illustrates a sputtering process for transferring co-alloy from the depositing substrate to the receiving substrate, according to an embodiment.

FIG. 4 illustrates a sputtering process for transferring the co-alloy 240 from the depositing substrate 310 to the receiving substrate 110 with the photoresist mask 360, according to an embodiment. The co-alloy 240 is transferred through sputtering deposition 410 to form co-alloy portions 420 on the photoresist mask 360 and on the exposed surface portions 370 of the receiving substrate 110. The co-alloy can be transferred through other methods (including single or multiple sources), such as electron beam deposition, thermal evaporation, and vacuum evaporation.] The surface of the co-alloy 240 faces the receiving substrate 110 (e.g., at an angle) such that particles of the co-alloy 240 can be ejected towards the receiving substrate 110 during the sputtering process 410.

Sputtering deposition 410 is a process where particles of the co-alloy 240 are ejected from the depositing substrate 310 due a bombardment of energetic particles, such as ions or electrons. Due to the proximity of the receiving substrate 110 to the depositing substrate 210, the ejected particles of the co-alloy 240 can be transferred to the photoresist mask 360 and the exposed surface portions 370. In some embodiments, the co-alloy portions 420 form a film over the photoresist mask 360 and exposed surface portions 370. In some embodiments, instead of transferring a co-alloy 240 from a single source (e.g., the depositing substrate 210 illustrated in FIG. 4), multiple depositing substrates are used. For example, copper on a first depositing substrate and zinc on a second depositing substrate are simultaneously transferred to the receiving substrate 110 to form copper zinc (CuZn) co-alloy portions.

Figure 5A:
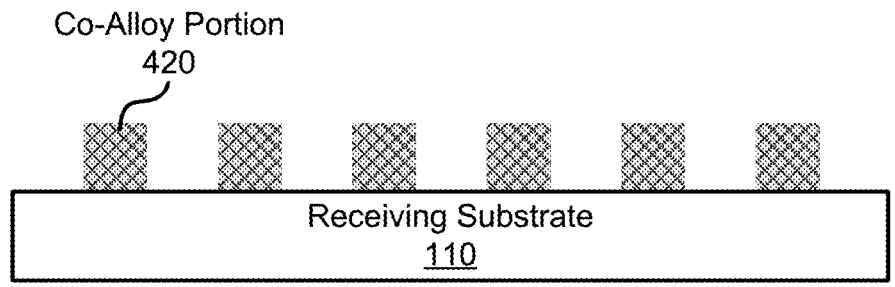
FIG. 5A illustrates co-alloy portions on the receiving substrate without the photoresist mask, according to an embodiment.

FIG. 5A illustrates co-alloy portions 420 on the receiving substrate 110 without the photoresist mask 360, according to an embodiment. After depositing the co-alloy 420, the photoresist mask 360 and the portions co-alloy 420 on the photoresist mask 360 can be removed (e.g., by a lift off process). The remaining portions can form an array of co-alloy portions 420. In some embodiments, after the photoresist mask 360 is removed, an annealing step is performed to bond the co-alloy portions 420 (or the nanoporous contacts 140 of FIG. 5B) to the receiving substrate 110.

In other embodiments, the co-alloy 240 is transferred to the receiving substrate 110 without a photoresist mask 360. In these embodiments, the co-alloy portions 420 can be formed by applying a hard mask, such as an oxide, on the film of transferred co-alloy. Afterwards, a chemical-mechanical planarization (CMP) process can be used to remove portions of the transferred co-alloy to form the discrete co-alloy portions illustrated in FIG. 5A. The hard mask may be removed by etching. In these embodiments, if two semiconductor substrates are being bonded together and the hard mask is an oxide of silicon, then oxide bonding as well as metal bonding can occur when the two semiconductor faces are brought together during the bond process.

Figure 5B:
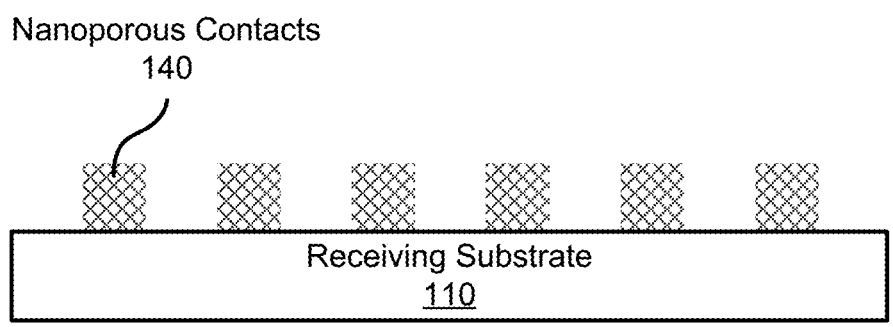
FIG. 5B illustrates nanoporous contacts on the receiving substrate, according to an embodiment.

FIG. 5B illustrates nanoporous contacts 140 on the receiving substrate 110, according to an embodiment. The nanoporous contacts 140 are formed by de-alloying the co-alloy portions 420. During the de-alloying process, the less noble metal in the co-alloy is removed and, the noble metal atoms can re-order to form a nanoporous structure. The co-alloy portions 420 can be de-alloyed by an etching process or reverse electro-deposition bonding. For example, if the co-alloy is a gold-silver co-alloy, the silver can be removed through corrosive etching (e.g., nitric acid) to produce an open pore network structure that consists mostly of gold. The nanoporous contacts 140 may be further modified by thermal treatment. Continuing from the previous example, heating the nanoporous gold can increase the surface diffusion of the gold atoms and result in an increase in the average pore size.

Figure 6A:
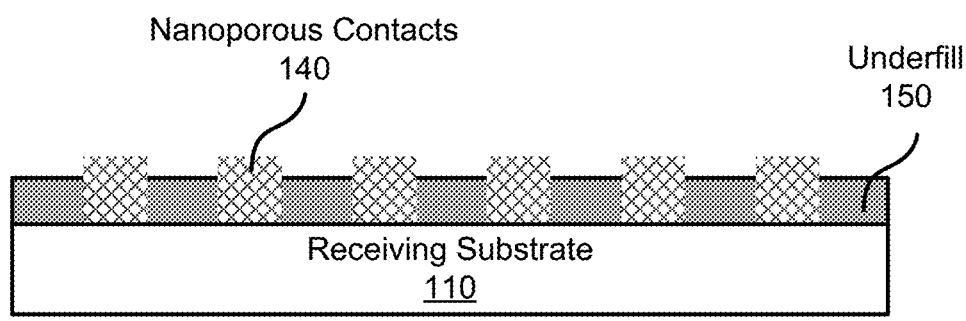
FIG. 6A illustrates an underfill formed between the nanoporous contacts on the surface of the receiving substrate, according to an embodiment.

FIG. 6A illustrates an underfill 150 formed between the nanoporous contacts 140 on the surface of the receiving substrate 110, according to an embodiment. Prior to forming a bond between an electrical component 120 and the receiving substrate 110, an underfill 150 may be deposited. An underfill 150 can increase the joint reliability of the metallic contact 160, and also the bonding between the receiving substrate 110 and the electronic component 120. The underfill 150 can be formed by depositing underfill material along an edge of the receiving substrate 110 and heating the material until it flows across the substrate 310. After placement, the underfill 150 can be cured by microwaves, UV light, or heat from the bonding process. In some embodiments, the underfill 150 is a B-staged adhesive polymer.

Figure 6B:
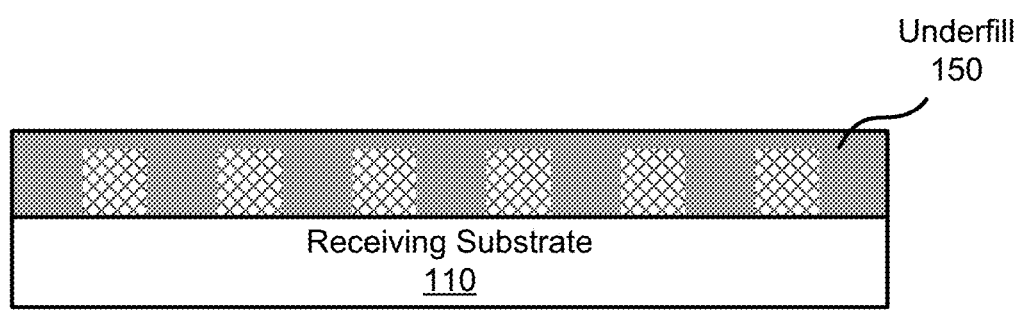
FIG. 6B illustrates an underfill formed over and between the nanoporous contacts, according to an embodiment.

In some embodiments, the underfill 150 is formed over and between the nanoporous contacts 140 (as illustrated in FIG. 6B). In these embodiments, the top surface of the underfill 150 can be etched away to expose the nanoporous contacts 140 (e.g., by reactive ion-etching (ME)). This exposes the nanoporous contacts 140 such that an electrical connection can be established between an electrical component 120 and the receiving substrate 110 through the nanoporous contacts 140.

Figure 7:
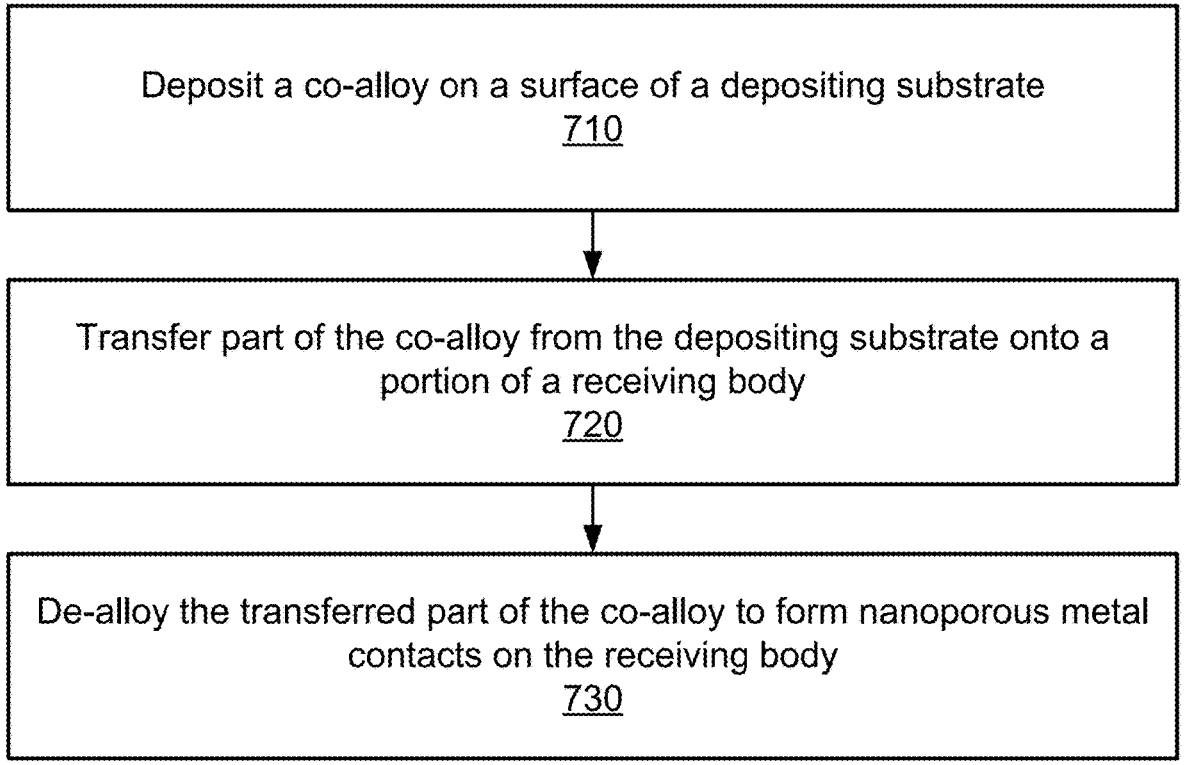
FIG. 7 is a flow chart illustrating a method for forming nanoporous contacts on a receiving substrate, according to an embodiment.

FIG. 7 is a flow chart illustrating a method for forming nanoporous contacts on a receiving body, according to an embodiment. The steps of method may be performed in different orders, and the method may include different, additional, or fewer steps. Furthermore, the body can refer to a substrate or an electronic component.

A co-alloy is formed 710 on a surface of a depositing body. The co-alloy can includes copper (Cu) and zinc (Zn). Alternatively, the co-alloy can include gold (Au) and silver (Ag).

Part of the co-alloy is transferred 720 from the depositing substrate onto at least a portion of a receiving body. Transferring part of the co-alloy can include the sputtering of particles of the co-alloy from the depositing substrate onto the receiving body by exposing the co-alloy on the surface of the depositing substrate to an ion beam.

The transferred part of the co-alloy is de-alloyed 730 to form nanoporous metal contacts on the receiving body. A film of underfill can be applied to cover a surface of the receiving body and the nanoporous metal contacts after de-alloying the transferred portions. Portions of the underfill can be etched to expose the nanoporous metal contacts. Contacts of another substrate or an electronic component can be pressed onto the nanoporous metal contacts to bond the other substrate or the electronic component to the receiving body. In some embodiments, the nanoporous metal contacts are formed on pre-formed metal contacts of the receiving body.

In some embodiments, a mask is applied over a surface of the receiving body before transferring part of the co-alloy from the depositing substrate. The mask selectively exposes portions of the surface of the receiving body. The mask can be applied over the receiving body by forming a photoresist on the receiving body. A photolithographic mask is applied over the photoresist to selectively cover the photoresist. Portions of the photoresist are exposed to light that are not covered by the photolithographic mask to cure portions of the photoresist. The cured portions of the photoresist are removed. After part of the co-alloy is transferred, the mask is removed from the surface of the receiving body.

In some embodiments, electrodes of one or more mounting bodies are aligned with the nanoporous metal contacts of the receiving body. The one or more mounting bodies are placed on the substrate. The one or more mounting bodies can be bonded to the receiving body by pressing the electrodes onto the nanoporous metal contacts to form metallic contacts between the mounting bodies and the receiving body. In some embodiments, the receiving body comprises a substrate and the mounting bodies comprise electronic components. In some embodiments, the bonding temperature is not greater than 150° C.

The method described herein can be applied to bonding a substrate or electronic component to another substrate or electronic component. In these embodiments, the same principle of depositing a co-alloy and de-alloying the co-alloy are performed to form nanoporous contacts on one or both sides of the substrates/electronic components.

While particular embodiments and applications have been illustrated and described, it is to be understood that the invention is not limited to the precise construction and components disclosed herein and that various modifications, changes and variations which will be apparent to those skilled in the art may be made in the arrangement, operation and details of the method and apparatus disclosed herein without departing from the spirit and scope of the present disclosure.

What is claimed is:

1. A method, comprising:
   depositing a co-alloy on a surface of a depositing substrate;
   transferring part of the co-alloy from the depositing substrate onto at least a portion of a receiving body; and
   de-alloying the transferred part of the co-alloy to form nanoporous metal contacts on the receiving body.

2. The method of claim 1, further comprising:
   applying a mask over a surface of the receiving body before transferring part of the co-alloy from the depositing substrate; and
   removing the mask from the surface of the receiving body after transferring the part of the co-alloy.

3. The method of claim 1, wherein transferring part of the co-alloy comprises causing sputtering of particles of the co-alloy from the depositing substrate onto the receiving body by exposing the co-alloy on the surface of the depositing substrate to an ion beam.

4. The method of claim 1, further comprising:
   aligning electrodes of one or more mounting bodies with the nanoporous metal contacts of the receiving body;
   placing the one or more mounting bodies on the body; and
   bonding the electrodes to the nanoporous metal contacts by pressing the electrodes onto the nanoporous metal contacts to form metallic contacts between the mounting bodies and the receiving body.

5. The method of claim 4, wherein the receiving body comprises a substrate and the mounting bodies comprise electronic components.

6. The method of claim 4, wherein a bonding temperature is not greater than 150° C.

7. The method of claim 2, wherein applying the mask over the receiving body further comprises:
   forming a photoresist on the receiving body;
   applying a photolithographic mask over the photoresist to selectively cover the photoresist;
   exposing portions of the photoresist to light that are not covered with the photolithographic mask to cure portions of the photoresist; and
   removing the cured portions of the photoresist.

8. The method of claim 1, further comprising:
   applying a film of underfill to cover a surface of the receiving body and the nanoporous metal contacts after de-alloying the transferred portions;
   etching portions of the underfill to expose the nanoporous metal contacts; and
   pressing contacts of another body or an electronic component onto the nanoporous metal contacts to bond the other body or the electronic component to the receiving body.

9. The method of claim 1, wherein the co-alloy includes copper (Cu) and zinc (Zn) or gold (Au) and silver (Ag).

10. The method of claim 1, wherein the nanoporous metal contacts are formed on pre-formed metal contacts of the receiving body.

11. The method of claim 1, further comprising removing portions of the transferred part of the co-alloy from the receiving body before de-alloying.

12. An assembly fabricated by a process comprising:
    depositing a co-alloy on a surface of a depositing substrate;
    transferring part of the co-alloy from the depositing substrate onto at least a portion of a receiving body; and
    de-alloying the transferred part of the co-alloy to form nanoporous metal contacts on the receiving body.

13. The assembly of claim 12, wherein the process further comprises:
    applying a mask over a surface of the receiving body before transferring part of the co-alloy from the depositing substrate; and
    removing the mask from the surface of the receiving body after transferring the part of the co-alloy.

14. The assembly of claim 12, wherein transferring part of the co-alloy comprises causing sputtering of particles of the co-alloy from the depositing substrate onto the receiving body by exposing the co-alloy on the surface of the depositing substrate to an ion beam.

15. The assembly of claim 12, wherein the process further comprises:
    aligning electrodes of one or more mounting bodies with the nanoporous metal contacts of the receiving body;
    placing the one or more mounting bodies on the body; and
    bonding the electrodes to the nanoporous metal contacts by pressing the electrodes onto the nanoporous metal contacts to form metallic contacts between the mounting bodies and the receiving body.

16. The assembly of claim 15, wherein the receiving body comprises a substrate and the mounting bodies comprise electronic components.

17. The assembly of claim 15, wherein a bonding temperature is not greater than 150° C.

18. The assembly of claim 13, wherein applying the mask further comprises:
- forming a photoresist on the receiving body;
- applying a photolithographic mask over the photoresist to selectively cover the photoresist;
- exposing portions of the photoresist to light that are not covered with the photolithographic mask to cure portions of the photoresist; and
- removing the cured portions of the photoresist.

19. The assembly of claim 12, wherein the process further comprises:
- applying a film of underfill to cover a surface of the receiving body and the nanoporous metal contacts after de-alloying the transferred portions;
- etching portions of the underfill to expose the nanoporous metal contacts; and
- pressing contacts of another body or an electronic component onto the nanoporous metal contacts to bond the other body or the electronic component to the receiving body.

20. The assembly of claim 12, wherein the co-alloy includes copper (Cu) and zinc (Zn) or gold (Au) and silver (Ag).

* * * * *